United States Patent
Iwamoto (10) Patent No.: US 12,537,508 B2
(45) Date of Patent: Jan. 27, 2026

(54) ACOUSTIC WAVE DEVICE

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 914 days.

(21) Appl. No.: 17/731,548

(22) Filed: Apr. 28, 2022

(65) Prior Publication Data

US 2022/0263493 A1 Aug. 18, 2022

Related U.S. Application Data (63) Continuation of application No. PCT/JP2020/040894, filed on Oct. 30, 2020.

(30) Foreign Application Priority Data

Nov. 6, 2019 (JP) .................. 2019-201523

(51) Int. Cl.
*H03H 9/25* (2006.01)
*H03H 9/02* (2006.01)

(52) U.S. Cl.
CPC .......... *H03H 9/25* (2013.01); *H03H 9/02559* (2013.01); *H03H 9/02566* (2013.01)

(58) Field of Classification Search
CPC ... H03H 9/25; H03H 9/02559; H03H 9/02566
USPC ..................................... 310/313 R
See application file for complete search history.

(56) References Cited

U.S. PATENT DOCUMENTS

| | | |
|---|---|---|
| 2004/0173816 A1 | 9/2004 | Saxler |
| 2006/0289901 A1* | 12/2006 | Sheppard ............... H10N 39/00 257/256 |
| 2007/0090898 A1* | 4/2007 | Kando ............... H03H 9/14538 333/195 |
| 2013/0285768 A1 | 10/2013 | Watanabe et al. |
| 2015/0069882 A1 | 3/2015 | Umeda et al. |
| 2020/0058842 A1 | 2/2020 | Akiyama et al. |
| 2020/0328823 A1 | 10/2020 | Nakagawa et al. |

FOREIGN PATENT DOCUMENTS

| | | | |
|---|---|---|---|
| FR | 3033462 A1 * | 9/2016 | ............... H03H 3/04 |
| JP | 05-183377 A | 7/1993 | |
| JP | 08-310900 A | 11/1996 | |
| JP | 2006-524016 A | 10/2006 | |
| JP | 2015-115870 A | 6/2015 | |

(Continued)

OTHER PUBLICATIONS

Grousset Sebastien, Ballandras Sylvain, FR 3033462, Publish Date Sep. 9, 2016 (Year: 2016).*

(Continued)

*Primary Examiner* — Bumsuk Won
(74) *Attorney, Agent, or Firm* — Keating & Bennett, LLP (57) ABSTRACT

An acoustic wave device includes a supporting substrate, a piezoelectric layer, and an IDT electrode. The piezoelectric layer is on the supporting substrate. The IDT electrode is on the piezoelectric layer. The supporting substrate is a silicon carbide substrate, which has a hexagonal crystal structure. The acoustic wave device uses an SH wave as a main mode.

16 Claims, 6 Drawing Sheets

(56) References Cited

FOREIGN PATENT DOCUMENTS

| JP | 2017-026906 A | 2/2017 |
| WO | 2012/086639 A1 | 6/2012 |
| WO | 2013/172251 A1 | 11/2013 |
| WO | 2018/088093 A1 | 5/2018 |
| WO | 2019/082806 A1 | 5/2019 |
| WO | 2019/138812 A1 | 7/2019 |

OTHER PUBLICATIONS

Official Communication issued in International Patent Application No. PCT/JP2020/040894, mailed on Dec. 28, 2020.

* cited by examiner

ACOUSTIC WAVE DEVICE

CROSS REFERENCE TO RELATED APPLICATIONS

This application claims the benefit of priority to Japanese Patent Application No. 2019-201523 filed on Nov. 6, 2019 and is a Continuation Application of PCT Application No. PCT/JP2020/040894 filed on Oct. 30, 2020. The entire contents of each application are hereby incorporated herein by reference.

BACKGROUND OF THE INVENTION

1. Field of the Invention

The present invention relates to an acoustic wave device.

2. Description of the Related Art

In the related art, acoustic wave devices are widely used, for example, in filters for cellular phones. International Publication No. 2012/086639 discloses an example of an acoustic wave device. In this acoustic wave device, a piezoelectric film is disposed on a supporting substrate, and an interdigital transducer (IDT) electrode is disposed on the piezoelectric film. Silicon, silicon carbide, or the like is used in the supporting substrate. Lithium tantalate, lithium niobate, or the like is used in the piezoelectric film.

However, studies conducted by the inventor of preferred embodiments of the present invention discovered that in acoustic wave devices such as that mentioned above, characteristics for a main mode may deteriorate, and a large spurious noise due to a Rayleigh wave may be generated, in some cases, depending on, for example, a form of the crystal of silicon carbide used in the supporting substrate.

SUMMARY OF THE INVENTION

Preferred embodiments of the present invention provide acoustic wave devices that each include a silicon carbide substrate defining a supporting substrate and in which characteristics for a main mode are improved, and spurious noise due to a Rayleigh wave is able to be reduced or prevented.

An acoustic wave device according to a preferred embodiment of the present invention includes a supporting substrate, a piezoelectric layer, and an IDT electrode. The piezoelectric layer is on the supporting substrate. The IDT electrode is on the piezoelectric layer. The supporting substrate is a silicon carbide substrate including a hexagonal crystal structure, and the acoustic wave device is configured to use an SH wave as a main mode.

Preferred embodiments of the present invention provide acoustic wave devices that each include a silicon carbide substrate defining a supporting substrate and in which characteristics for a main mode are improved, and spurious noise due to a Rayleigh wave is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

The preferred embodiments described in this specification are illustrative, and components or features of one preferred embodiment may be partially replaced or combined with components or features of other preferred embodiment(s).

Figure 1:
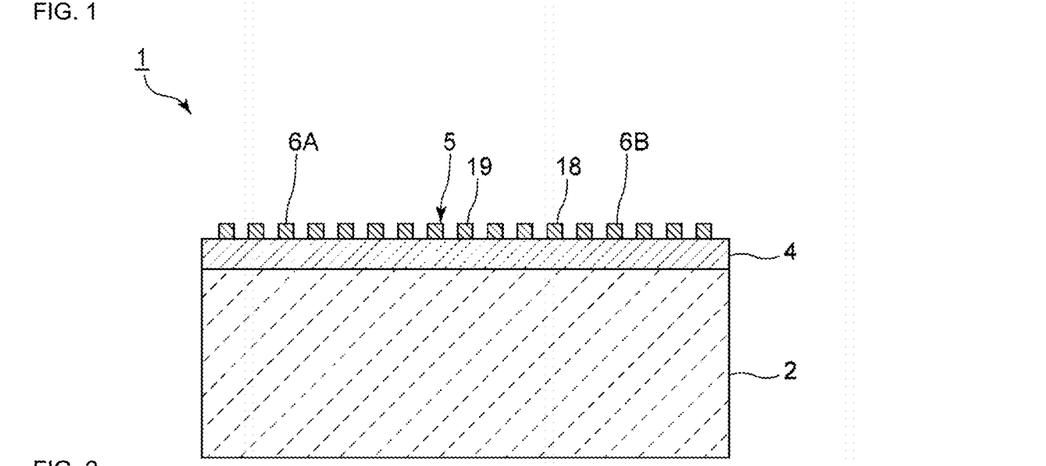
FIG. 1 is a cross-sectional elevation view of an acoustic wave device according to a first preferred embodiment of the present invention.

FIG. 1 is a cross-sectional elevation view of an acoustic wave device according to a first preferred embodiment of the present invention.

An acoustic wave device 1 includes a supporting substrate. The supporting substrate of the present preferred embodiment is, for example, a silicon carbide substrate 2. More specifically, the silicon carbide substrate 2 has a crystal structure that is, for example, a 4H-SiC hexagonal crystal structure. The silicon carbide substrate 2 may have a hexagonal crystal structure other than the 4H-SiC hexagonal crystal structure, such as, for example, a 6H-SiC hexagonal crystal structure.

A piezoelectric layer 4 is disposed directly on the silicon carbide substrate 2. The piezoelectric layer 4 of the present preferred embodiment is, for example, a lithium tantalate layer. An IDT electrode 5 is disposed on the piezoelectric layer 4. When an AC voltage is applied to the IDT electrode 5, an acoustic wave is excited. The acoustic wave device 1 uses an SH wave as a main mode.

A pair of reflectors, namely, a reflector 6A and a reflector 6B, are disposed on the piezoelectric layer 4, on both sides of the IDT electrode 5 in an acoustic wave propagation direction. The acoustic wave device 1 of the present preferred embodiment is, for example, a surface acoustic wave resonator. Acoustic wave devices according to preferred embodiments of the present invention is not limited to a surface acoustic wave resonator and may be, for example, a filter device including a plurality of surface acoustic wave resonators.

Figure 2:
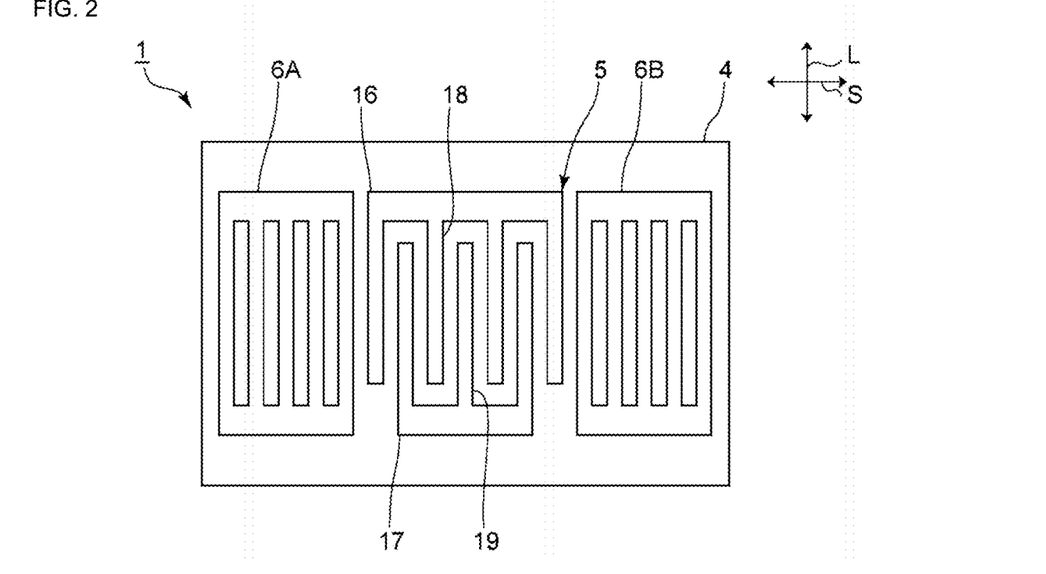
FIG. 2 is a plan view of the acoustic wave device according to the first preferred embodiment of the present invention.

FIG. 2 is a plan view of the acoustic wave device according to the first preferred embodiment.

The IDT electrode 5 includes a first busbar 16 and a second busbar 17, which face each other. The IDT electrode 5 includes first electrode fingers 18, and one end of each of the first electrode fingers 18 is connected to the first busbar 16. In addition, the IDT electrode 5 includes second electrode fingers 19, and one end of each of the second electrode fingers 19 is connected to the second busbar 17. The first electrode fingers 18 and the second electrode fingers 19 are interdigitated with each other.

The IDT electrode 5 is made of, for example, a single-layer Al film. The reflector 6A and the reflector 6B are made of a material the same as or similar to a material of the IDT electrode 5. The material of the IDT electrode 5 and the material of the reflector 6A and the reflector 6B are not limited to the material described above. Alternatively, the IDT electrode 5, the reflector 6A, and the reflector 6B may each include a metal stack film in which metal layers are stacked.

Details of the silicon carbide substrate 2 of the present preferred embodiment will be described below.

Figure 3:
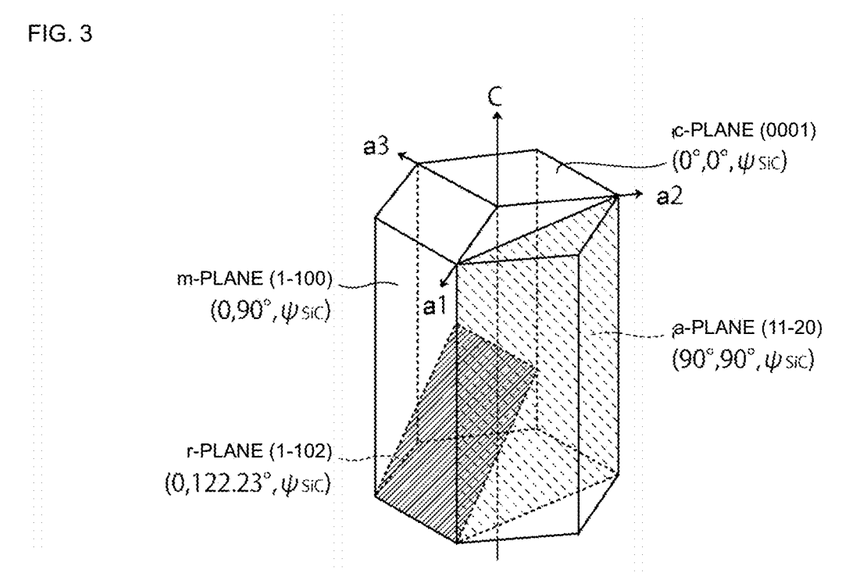
FIG. 3 is a schematic diagram illustrating a definition of crystal axes of silicon carbide and also illustrating an a-plane, an m-plane, a c-plane, and an r-plane of the silicon carbide.

FIG. 3 is a schematic diagram illustrating a definition of crystal axes of silicon carbide and also illustrating an a-plane, an m-plane, a c-plane, and an r-plane of the silicon carbide.

As illustrated in FIG. 3, the silicon carbide substrate is, for example, a silicon carbide single-crystal substrate including a 4H-SiC hexagonal crystal structure. In this specification, the crystal axes of the silicon carbide of the silicon carbide substrate 2 are (a1, a2, a3, and c). In silicon carbide, the a1 axis, the a2 axis, and the a3 axis are the same or substantially the same as one another because of the symmetry of the crystal structure.

In the acoustic wave device 1, a major surface of the silicon carbide substrate 2 is, for example, an a-plane, an m-plane, a c-plane, or an r-plane. In an instance where a major surface of the silicon carbide substrate 2 is an a-plane, a major surface adjacent to the piezoelectric layer 4 in the silicon carbide substrate 2 is the (11-20) plane. The (11-20) plane is a plane orthogonal or substantially orthogonal to a crystal axis represented by a Miller index of [11-20] in a crystal structure. In this state, a propagation angle $\psi_{SiC}$ of an acoustic wave in the silicon carbide substrate 2 is an angle between the acoustic wave propagation direction and the Miller index crystal orientation [0001] of the silicon carbide, as viewed from above a major surface of the piezoelectric layer 4, the major surface being a surface on which the IDT electrode 5 is provided. In this instance, Euler angles of the silicon carbide substrate 2 are designated as ($\varphi_{SiC}$, $\theta_{SiC}$, $\psi_{SiC}$). $\psi_{SiC}$ of the Euler angles is the propagation angle $\psi_{SiC}$ mentioned above. The (11-20) plane can be expressed, for example, as (90°, 90°, $\psi_{SiC}$) in a Euler angle representation.

In an instance where a major surface of the silicon carbide substrate 2 is a c-plane, a major surface adjacent to the piezoelectric layer 4 in the silicon carbide substrate 2 is the (0001) plane. In this state, the propagation angle $\psi_{SiC}$ of the silicon carbide substrate 2 is an angle between the acoustic wave propagation direction and the Miller index crystal orientation [1000] of the silicon carbide, as viewed from above a major surface of the piezoelectric layer 4, the major surface being a surface on which the IDT electrode 5 is provided. The (0001) plane can be expressed, for example, as (0°, 0°, $\psi_{SiC}$) in a Euler angle representation.

In an instance where a major surface of the silicon carbide substrate 2 is an m-plane, a major surface adjacent to the piezoelectric layer 4 in the silicon carbide substrate 2 is the (1-100) plane. In this state, the propagation angle $\psi_{SiC}$ of the silicon carbide substrate 2 is an angle between the acoustic wave propagation direction and the Miller index crystal orientation [0001] of the silicon carbide, as viewed from above a major surface of the piezoelectric layer 4, the major surface being a surface on which the IDT electrode 5 is provided. The (1-100) plane can be expressed, for example, as (0°, 90°, $\psi_{SiC}$) in a Euler angle representation.

In an instance where a major surface of the silicon carbide substrate 2 is an r-plane, a major surface adjacent to the piezoelectric layer 4 in the silicon carbide substrate 2 is the (1-102) plane. In this state, the propagation angle $\psi_{SiC}$ of the silicon carbide substrate 2 is an angle between the acoustic wave propagation direction and the Miller index crystal orientation [1-10-1] of the silicon carbide, as viewed from above a major surface of the piezoelectric layer 4, the major surface being a surface on which the IDT electrode 5 is provided. The (1-102) plane can be expressed, for example, as (0°, 122.23°, $\psi_{SiC}$) in a Euler angle representation. Note that the orientations of the planes or Euler angles of the silicon carbide substrate 2 are not limited to those mentioned.

Features of the present preferred embodiment are that piezoelectric layer 4 and the silicon carbide substrate 2, which have a 4H-SiC hexagonal crystal structure, are stacked on top of each other and that the acoustic wave device 1 uses an SH mode. Consequently, spurious noise due to a Rayleigh wave can be reduced or prevented in the acoustic wave device 1 in which the silicon carbide substrate 2 is used. Details of this will be described below.

An acoustic wave device 1 having the configuration of the first preferred embodiment and the following design parameters was prepared. In this instance, a wavelength defined by an electrode finger pitch of the IDT electrode 5 is designated as λ. The electrode finger pitch is an average value of distances between electrode finger centers of adjacent electrode fingers in the IDT electrode 5.

Silicon carbide substrate 2: SiC having a 4H-SiC hexagonal crystal structure as a material;
Piezoelectric layer 4: 0° Y—LiTaO$_3$ as a material; and a thickness of about 0.2λ; and
IDT electrode 5: Al as a material; and a thickness of about 0.05λ.

In this instance, the major surface of the silicon carbide substrate 2 is an r-plane. A simulation was performed with the acoustic wave device 1 as follows: the electromechanical coupling coefficient of an SH wave, which was used as the main mode, and the electromechanical coupling coefficient of a Rayleigh wave, which would become spurious noise, were determined, with the propagation angle $\psi_{SiC}$ being changed over a range of about 0° or greater and about 180° or less.

Figure 4:
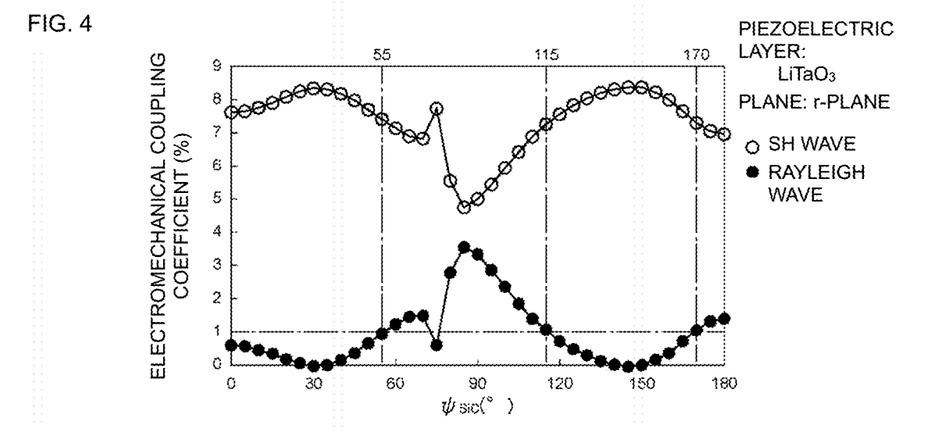
FIG. 4 is a graph illustrating a relationship between a propagation angle $\psi_{SiC}$ and electromechanical coupling coefficients of an SH wave and a Rayleigh wave, regarding an instance in which a major surface of a silicon carbide substrate is an r-plane, in the first preferred embodiment of the present invention.

FIG. 4 is a graph illustrating a relationship between the propagation angle $\psi_{SiC}$ and the electromechanical coupling coefficients of an SH wave and a Rayleigh wave, regarding an instance in which the major surface of a silicon carbide substrate is an r-plane, in the first preferred embodiment of the present invention.

From FIG. 4, it is apparent that the Rayleigh wave is reduced or prevented even with changes in the propagation angle $\psi_{SiC}$. Note that it is apparent that the electromechanical coupling coefficient of the SH wave is greater than the electromechanical coupling coefficient of the Rayleigh wave, even with changes in the propagation angle $\psi_{SiC}$. Thus, in the first preferred embodiment, spurious noise due to a Rayleigh wave can be easily reduced or prevented.

In the instance where the major surface of the silicon carbide substrate 2 is an r-plane, it is preferable that the propagation angle $\psi_{SiC}$ is, for example, within a range of about 0° or greater and about 55° or less or within a range of about 115° or greater and about 170° or less. In such cases, the electromechanical coupling coefficient of the Rayleigh wave can be less than or equal to about 1%, that is, spurious noise due to a Rayleigh wave can be further reduced or prevented.

The following description is provided to indicate that the reduction or prevention of a Rayleigh wave can also be achieved in instances in which the major surface of the silicon carbide substrate 2 is a plane other than an r-plane. Simulations the same as or similar to the simulation described above were performed with acoustic wave devices 1 having the configuration of the first preferred embodiment and design parameters the same as or similar to those for the acoustic wave device 1 with which the electromechanical coupling coefficients shown in FIG. 4 were determined; the respective major surfaces of the silicon carbide substrates 2 were an a-plane, an m-plane, and a c-plane.

Figure 5:
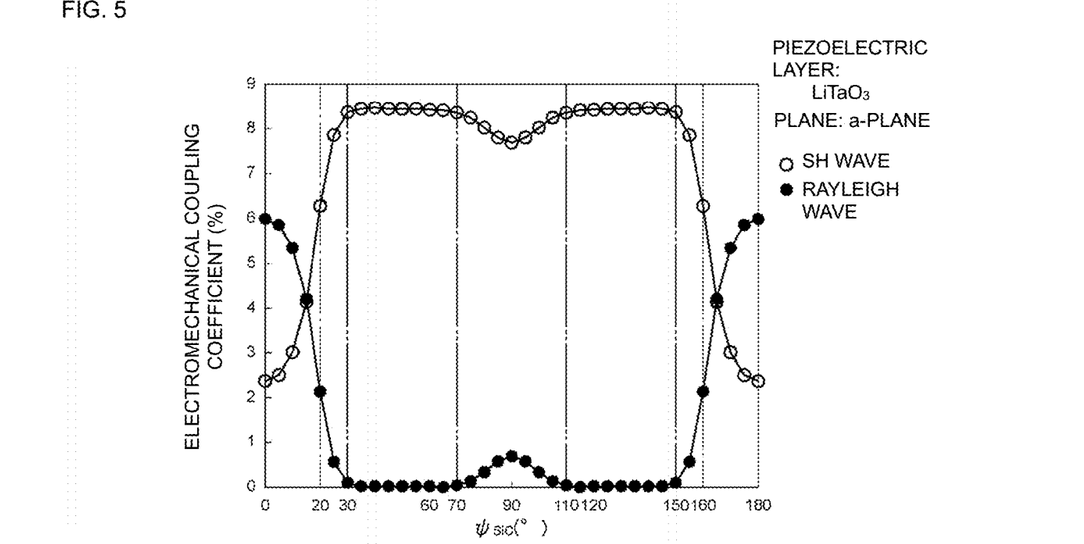
FIG. 5 is a graph illustrating a relationship between the propagation angle $\psi_{SiC}$ and the electromechanical coupling coefficients of an SH wave and a Rayleigh wave, regarding an instance in which a major surface of the silicon carbide substrate is an a-plane, in the first preferred embodiment of the present invention.

FIG. 5 is a graph illustrating a relationship between the propagation angle $\psi_{SiC}$ and the electromechanical coupling coefficients of an SH wave and a Rayleigh wave, regarding an instance in which the major surface of the silicon carbide substrate is an a-plane, in the first preferred embodiment.

FIG. 5 indicates that spurious noise due to a Rayleigh wave is also reduced or prevented in the instance in which the major surface of the silicon carbide substrate 2 is an a-plane, for almost all of the propagation angles $\psi_{SiC}$. That is, it is apparent that spurious noise due to a Rayleigh wave can also be easily reduced or prevented in the instance in which the major surface of the silicon carbide substrate 2 is an a-plane. In the instance where the major surface of the silicon carbide substrate 2 is an a-plane, it is preferable that the propagation angle $\psi_{SiC}$ is, for example, within a range of about 20° or greater and about 160° or less. In this case, the electromechanical coupling coefficient of an SH wave can be effectively increased, and spurious noise due to a Rayleigh wave can be effectively reduced or prevented. It is more preferable that the propagation angle $\psi_{SiC}$ is, for example, within a range of about 30° or greater and about 70° or less or within a range of about 110° or greater and about 150° or less. In this case, spurious noise due to a Rayleigh wave can be further reduced or prevented.

Figure 6:
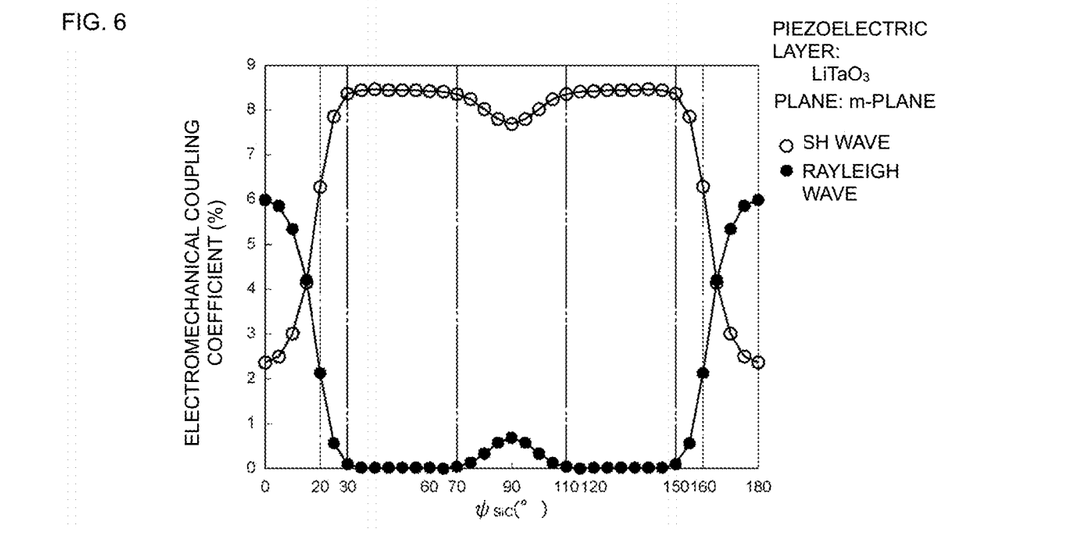
FIG. 6 is a graph illustrating a relationship between the propagation angle $\psi_{SiC}$ and the electromechanical coupling coefficients of an SH wave and a Rayleigh wave, regarding an instance in which a major surface of the silicon carbide substrate is an m-plane, in the first preferred embodiment of the present invention.

FIG. 6 is a graph illustrating a relationship between the propagation angle $\psi_{SiC}$ and the electromechanical coupling coefficients of an SH wave and a Rayleigh wave, regarding an instance in which the major surface of the silicon carbide substrate is an m-plane, in the first preferred embodiment.

In the instance where the major surface of the silicon carbide substrate 2 is an m-plane, it is preferable that the propagation angle $\psi_{SiC}$ is, for example, within a range of about 20° or greater and about 160° or less, as with the instance in which the major surface is an a-plane. In this case, the electromechanical coupling coefficient of an SH wave can be effectively increased, and spurious noise due to a Rayleigh wave can be effectively reduced or prevented. It is more preferable that the propagation angle $\psi_{SiC}$ is, for example, within a range of about 30° or greater and about 70° or less or within a range of about 110° or greater and about 150° or less. In this case, spurious noise due to a Rayleigh wave can be further reduced or prevented.

Figure 7:
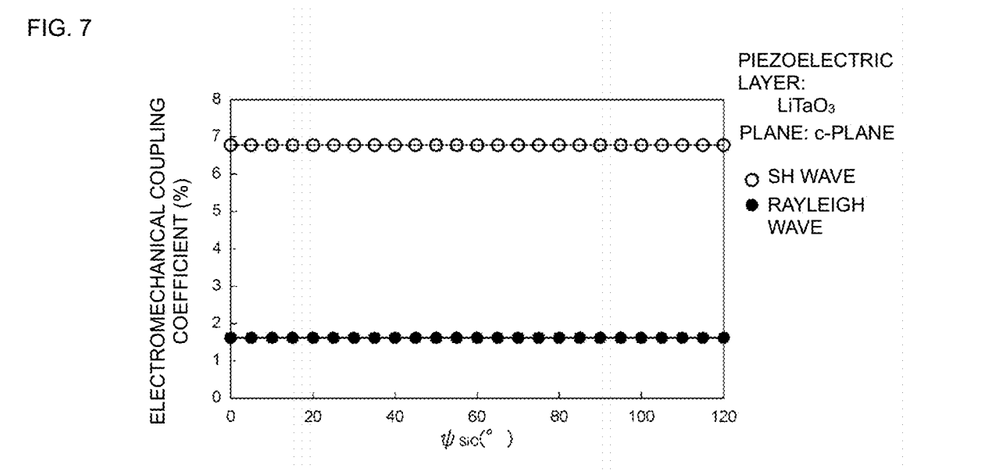
FIG. 7 is a graph illustrating a relationship between the propagation angle $\psi_{SiC}$ and the electromechanical coupling coefficients of an SH wave and a Rayleigh wave, regarding an instance in which a major surface of the silicon carbide substrate is a c-plane, in the first preferred embodiment of the present invention.
Figure 8:
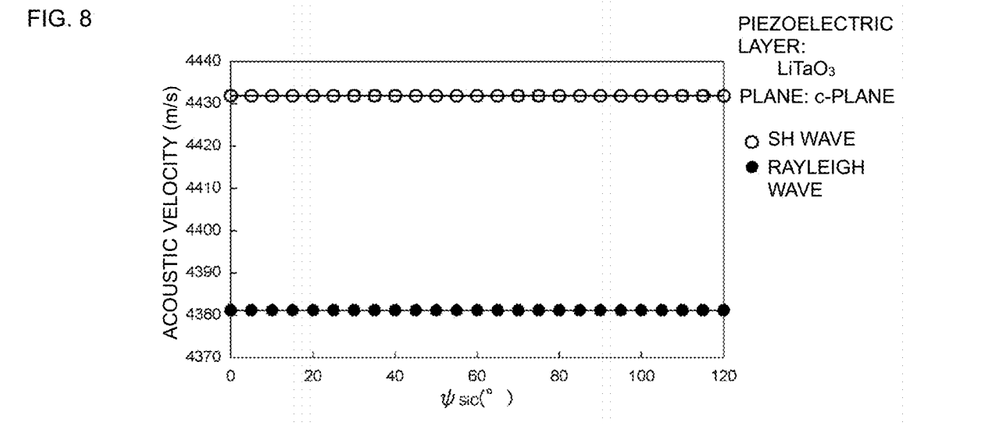
FIG. 8 is a graph illustrating a relationship between the propagation angle $\psi_{SiC}$ and acoustic velocities of an SH wave and a Rayleigh wave, regarding an instance in which a major surface of the silicon carbide substrate is a c-plane.

FIG. 7 is a graph illustrating a relationship between the propagation angle $\psi_{SiC}$ and the electromechanical coupling coefficients of an SH wave and a Rayleigh wave, regarding an instance in which the major surface of the silicon carbide substrate is a c-plane, in the first preferred embodiment. FIG. 8 is a graph illustrating a relationship between the propagation angle $\psi_{SiC}$ and acoustic velocities of an SH wave and a Rayleigh wave, regarding an instance in which the major surface of the silicon carbide substrate is a c-plane.

From FIG. 7, it is apparent that a Rayleigh wave can also be effectively reduced or prevented in the instance in which the major surface of the silicon carbide substrate 2 is a c-plane. In addition, FIG. 7 and FIG. 8 indicate that in the instance where the major surface of the silicon carbide substrate 2 is a c-plane, the electromechanical coupling coefficients and the acoustic velocities of an SH wave and a Rayleigh wave remain unchanged even with changes in the propagation angle $\psi_{SiC}$. Thus, it is unlikely that variations in characteristics occur even with changes in the propagation angle $\psi_{SiC}$. Accordingly, in the instance where the major surface of the silicon carbide substrate 2 is a c-plane, desired characteristics can be easily achieved regardless of variations in the propagation angle $\psi_{SiC}$.

In instances where a silicon carbide substrate 2 having a 4H-SiC hexagonal crystal structure is used, as in the present preferred embodiment, characteristics for the main mode can be improved. This will be described below. An acoustic wave device in which a silicon carbide substrate had a 3C-SiC cubic crystal structure was prepared to be used as a Comparative Example. 35° Y—LiTaO$_3$ was used in the piezoelectric layers of the acoustic wave devices 1 having the configuration of the present preferred embodiment and the Comparative Example.

Figure 9:
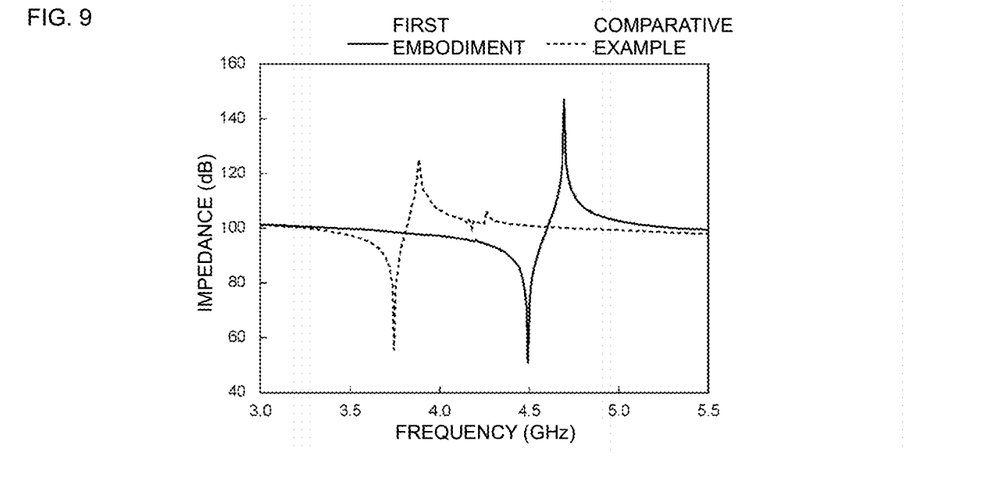
FIG. 9 is a graph illustrating impedance characteristics of an SH wave used as a main mode in the first preferred embodiment of the present invention and a Comparative Example.

FIG. 9 is a graph illustrating impedance characteristics of an SH wave used as the main mode in the first preferred embodiment and the Comparative Example.

From FIG. 9, it is apparent that while resistance at an anti-resonant frequency is approximately 130 dB in the Comparative Example, the resistance is high in the first preferred embodiment, namely, the resistance is approximately 148 dB. Thus, in the first preferred embodiment, in which the silicon carbide substrate 2 has a 4H-SiC hexagonal crystal structure, characteristics for the main mode are improved.

Figure 10:
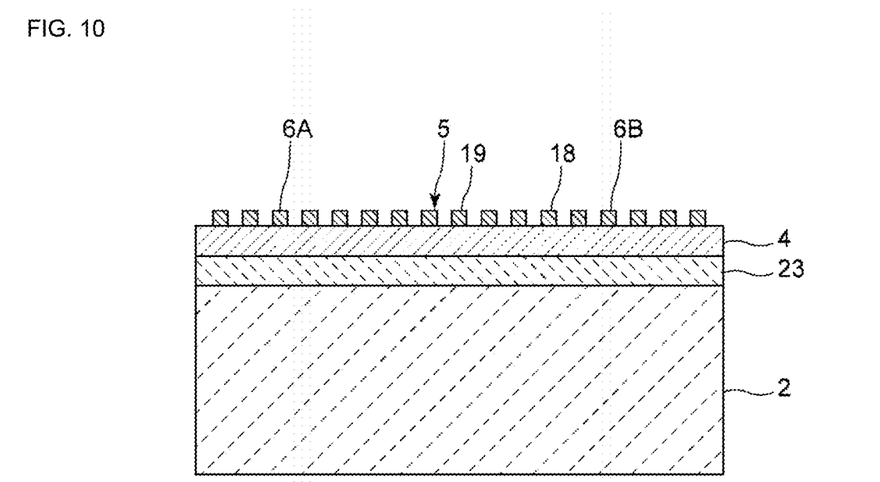
FIG. 10 is a cross-sectional elevation view of an acoustic wave device according to a modification of the first preferred embodiment of the present invention.

FIG. 10 is a cross-sectional elevation view of an acoustic wave device according to a modification of the first preferred embodiment of the present invention.

In the present modification, a low-acoustic-velocity film 23 is disposed between the silicon carbide substrate 2 and the piezoelectric layer 4. The low-acoustic-velocity film 23 has a relatively low acoustic velocity. More specifically, an acoustic velocity of a bulk wave that propagates through the low-acoustic-velocity film 23 is less than an acoustic velocity of a bulk wave that propagates through the piezoelectric layer 4. The low-acoustic-velocity film 23 of the present preferred embodiment is, for example, a silicon oxide film. Silicon oxide is represented by $SiO_x$. x is any suitable positive number. The silicon oxide of the low-acoustic-velocity film 23 of the present preferred embodiment is, for example, $SiO_2$. The material of the low-acoustic-velocity film 23 is not limited to the above-mentioned material. For example, it is possible to use glass, silicon oxynitride, lithium oxide, or a material in which a major component is a compound including silicon oxide with fluorine, carbon, or boron added thereto.

As described, the piezoelectric layer 4 may be disposed indirectly on the silicon carbide substrate 2 with the low-acoustic-velocity film 23 interposed therebetween. In this case as well, spurious noise due to a Rayleigh wave can be reduced or prevented as with the first preferred embodiment. In addition, in instances where the low-acoustic-velocity film 23 is, for example, a silicon oxide film as in the present modification, the absolute value of a temperature coefficient of frequency TCF of the acoustic wave device can be reduced. Accordingly, frequency-temperature characteristics can be improved.

While the piezoelectric layer 4 is, for example, a lithium tantalate layer in the first preferred embodiment, the piezoelectric layer 4 may be, for example, a lithium niobate layer. Advantageous effects of a second preferred embodiment of the present invention, in which the piezoelectric layer 4 is, for example a lithium niobate layer, will be described below. Since the configuration of the second preferred embodiment, except for the configuration of the piezoelectric layer 4, is the same as or similar to those of the first preferred embodiment, the same reference characters as those of FIG. 1 are used.

An acoustic wave device 1 having the configuration of the second preferred embodiment and the following design parameters was prepared.

Silicon carbide substrate 2: SiC having a 4H-SiC hexagonal crystal structure as a material;
Piezoelectric layer 4: 0° Y—$LiNbO_3$ as a material; and a thickness of about 0.2λ
IDT electrode 5: Al as a material; and a thickness of about 0.05λ

In this instance, the major surface of the silicon carbide substrate 2 is an r-plane. A simulation was performed with the acoustic wave device 1 as follows: the electromechanical coupling coefficient of an SH wave, which was used as the main mode, and the electromechanical coupling coefficient of a Rayleigh wave, which would become spurious noise, were determined, with the propagation angle $\psi_{SiC}$ being changed over a range of about 0° or greater and about 180° or less.

Figure 11:
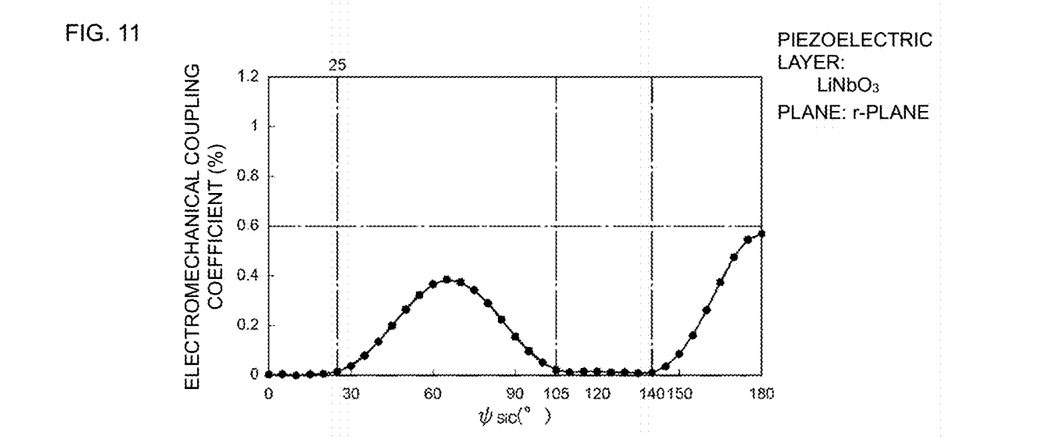
FIG. 11 is a graph illustrating a relationship between a propagation angle $\psi_{SiC}$ and an electromechanical coupling coefficient of a Rayleigh wave, regarding an instance in which a major surface of a silicon carbide substrate is an r-plane, in a second preferred embodiment of the present invention.

FIG. 11 is a graph illustrating a relationship between a propagation angle $\psi_{SiC}$ and an electromechanical coupling coefficient of a Rayleigh wave, regarding an instance in which the major surface of the silicon carbide substrate is an r-plane, in the second preferred embodiment.

From FIG. 11, it is apparent that the Rayleigh wave is reduced or prevented to less than about 0.6%, even with changes in the propagation angle $\psi_{SiC}$. Thus, spurious noise due to a Rayleigh wave can be easily reduced or prevented in the second preferred embodiment, as in the first preferred embodiment.

In the instance where the major surface of the silicon carbide substrate 2 is an r-plane, it is preferable that the propagation angle $\psi_{SiC}$ is, for example, within a range of about 0° or greater and about 25° or less or within a range of about 105° or greater and about 140° or less. In such cases, the electromechanical coupling coefficient of the Rayleigh wave can be nearly 0%, that is, spurious noise due to a Rayleigh wave can be more effectively reduced or prevented.

The following description is provided to indicate that the reduction or prevention of a Rayleigh wave can also be achieved in instances in which the major surface of the silicon carbide substrate 2 is a plane other than an r-plane. Simulations the same as or similar to the simulation described above were performed with acoustic wave devices 1 having the configuration of the second preferred embodiment and design parameters the same as or similar to those for the acoustic wave device 1 with which the electromechanical coupling coefficients shown in FIG. 11 were determined. The respective major surfaces of the silicon carbide substrates 2 were, for example, an a-plane, an m-plane, and a c-plane.

Figure 12:
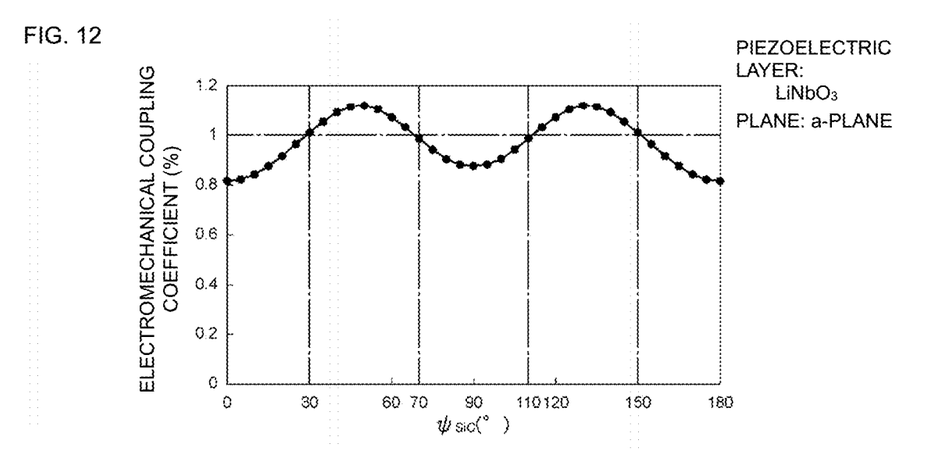
FIG. 12 is a graph illustrating a relationship between the propagation angle $\psi_{SiC}$ and the electromechanical coupling coefficient of a Rayleigh wave, regarding an instance in which a major surface of the silicon carbide substrate is an a-plane, in the second preferred embodiment of the present invention.

FIG. 12 is a graph illustrating a relationship between the propagation angle $\psi_{SiC}$ and the electromechanical coupling coefficient of a Rayleigh wave, regarding an instance in which the major surface of the silicon carbide substrate is an a-plane, in the second preferred embodiment.

From FIG. 12, it is apparent that the Rayleigh wave is reduced or prevented to less than about 1.2% in the instance in which the major surface of the silicon carbide substrate 2 is an a-plane, even with changes in the propagation angles $\psi_{SiC}$. Thus, spurious noise due to a Rayleigh wave can also be easily reduced or prevented in the instance in which the major surface of the silicon carbide substrate 2 is an a-plane. It is preferable that the propagation angle $\psi_{SiC}$ is, for example, within a range of about 0° or greater and about 30° or less, within a range of about 70° or greater and about 110° or less, or within a range of about 150° or greater and about 180° or less. In such cases, the electromechanical coupling coefficient of the Rayleigh wave can be less than or equal to about 1%, that is, spurious noise due to a Rayleigh wave can be further reduced or prevented.

Figure 13:
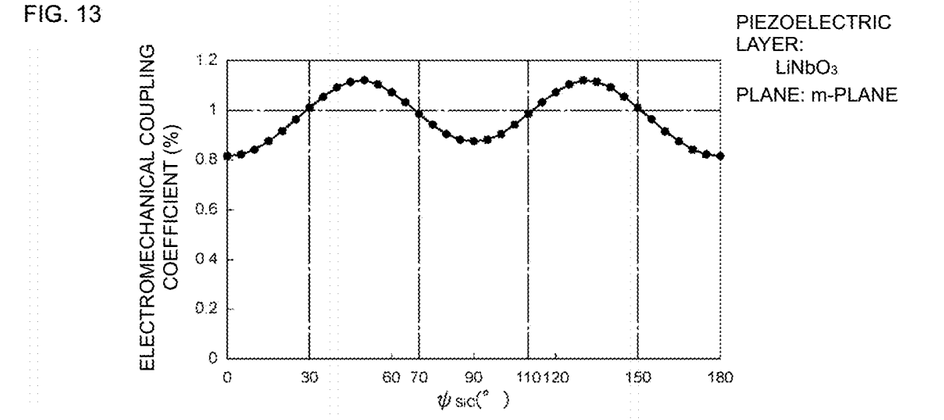
FIG. 13 is a graph illustrating a relationship between the propagation angle $\psi_{SiC}$ and the electromechanical coupling coefficient of a Rayleigh wave, regarding an instance in which a major surface of the silicon carbide substrate is an m-plane, in the second preferred embodiment of the present invention.

FIG. 13 is a graph illustrating a relationship between the propagation angle $\psi_{SiC}$ and the electromechanical coupling coefficient of a Rayleigh wave, regarding an instance in which the major surface of the silicon carbide substrate is an m-plane, in the second preferred embodiment.

From FIG. 13, it is apparent that in the instance where the major surface of the silicon carbide substrate 2 is an m-plane, the Rayleigh wave is reduced or prevented to less than about 1.2% even with changes in the propagation angle $\psi_{SiC}$, as in the instance where the major surface is an a-plane. Thus, spurious noise due to a Rayleigh wave can also be easily reduced or prevented in the instance in which the major surface of the silicon carbide substrate 2 is an m-plane. It is preferable that the propagation angle $\psi_{SiC}$ is, for example, within a range of about 0° or greater and about 30° or less, within a range of about 70° or greater and about 110° or less, or within a range of about 150° or greater and about 180° or less. In such cases, the electromechanical coupling coefficient of the Rayleigh wave can be less than or equal to about 1%, that is, spurious noise due to a Rayleigh wave can be further reduced or prevented.

Figure 14:
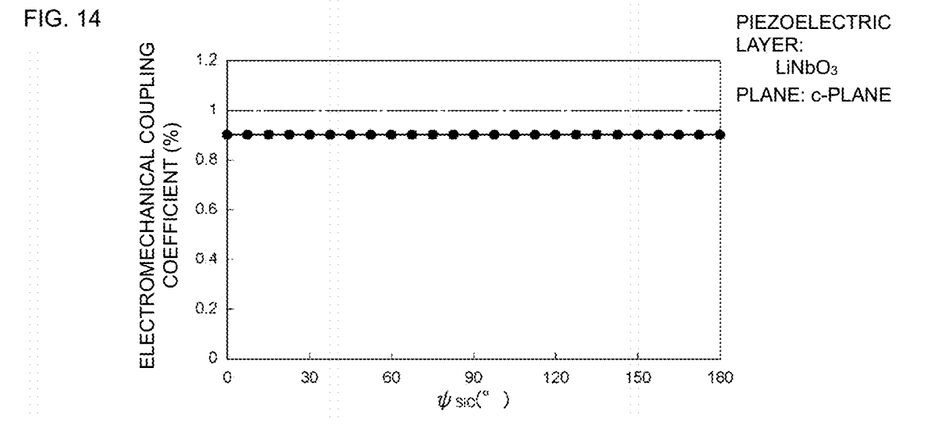
FIG. 14 is a graph illustrating a relationship between the propagation angle $\psi_{SiC}$ and the electromechanical coupling coefficient of a Rayleigh wave, regarding an instance in which a major surface of the silicon carbide substrate is a c-plane, in the second preferred embodiment of the present invention.

FIG. 14 is a graph illustrating a relationship between the propagation angle $\psi_{SiC}$ and the electromechanical coupling coefficient of a Rayleigh wave, regarding an instance in which the major surface of the silicon carbide substrate is, for example, a c-plane, in the second preferred embodiment.

FIG. 14 indicates that in the instance where the major surface of the silicon carbide substrate 2 is a c-plane, the electromechanical coupling coefficient of the Rayleigh wave is reduced to less than about 1% even with changes in the propagation angle $\psi_{SiC}$. Thus, spurious noise due to a Rayleigh wave can also be easily reduced or prevented in the instance in which the major surface of the silicon carbide substrate 2 is a c-plane. In addition, in the instance where the major surface of the silicon carbide substrate 2 is a c-plane, the electromechanical coupling coefficient of the Rayleigh wave remains unchanged even with changes in the propagation angle $\psi_{SiC}$. Accordingly, Rayleigh waves can be effectively reduced or prevented regardless of variations in the propagation angle $\psi_{SiC}$.

While FIG. 4 to FIG. 9 and FIG. 11 to FIG. 14 show characteristics associated with instances in which the silicon carbide substrate 2 has a 4H-SiC hexagonal crystal structure, it has been discovered that the same or similar characteristics are achieved in instances in which the silicon carbide substrate 2 has a 6H-SiC hexagonal crystal structure. That is, in instances where the silicon carbide substrate 2 has a 6H-SiC hexagonal crystal structure, characteristics for the main mode are improved, and spurious noise due to a Rayleigh wave can be reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a supporting substrate;
a piezoelectric layer on the supporting substrate; and
an IDT electrode on the piezoelectric layer; wherein
the supporting substrate is a silicon carbide substrate with a hexagonal crystal structure;
a major surface of the silicon carbide substrate is one of an a-plane and an m-plane;
a propagation angle $\psi_{SiC}$ in the silicon carbide substrate is within a range of about 30° or greater and about 70° or less or within a range of about 110° or greater and about 150° or less, where the propagation angle $\psi_{SiC}$ is an angle at which an acoustic wave propagates;
the piezoelectric layer includes lithium tantalate; and
the acoustic wave device is configured to use an SH wave as a main mode.

2. The acoustic wave device according to claim 1, wherein the silicon carbide substrate has a 4H-SiC hexagonal crystal structure.

3. The acoustic wave device according to claim 1, wherein the silicon carbide substrate has a 6H-SiC hexagonal crystal structure.

4. The acoustic wave device according to claim 1, further comprising:
a low-acoustic-velocity film between the silicon carbide substrate and the piezoelectric layer; wherein
an acoustic velocity of a bulk wave that propagates through the low-acoustic-velocity film is less than an acoustic velocity of a bulk wave that propagates through the piezoelectric layer.

5. An acoustic wave device comprising:
a supporting substrate;
a piezoelectric layer on the supporting substrate; and
an IDT electrode on the piezoelectric layer; wherein
the supporting substrate is a silicon carbide substrate with a hexagonal crystal structure;
a major surface of the silicon carbide substrate is an r-plane;
a propagation angle $\psi_{SiC}$ in the silicon carbide substrate is within a range of about 0° or greater and about 55° or less or within a range of about 115° or greater and about 170° or less, where the propagation angle $\psi_{SiC}$ is an angle at which an acoustic wave propagates;
the piezoelectric layer includes lithium tantalate; and
the acoustic wave device is configured to use an SH wave as a main mode.

6. The acoustic wave device according to claim 5, wherein the silicon carbide substrate has a 4H-SiC hexagonal crystal structure.

7. The acoustic wave device according to claim 5, wherein the silicon carbide substrate has a 6H-SiC hexagonal crystal structure.

8. The acoustic wave device according to claim 5, further comprising:
a low-acoustic-velocity film between the silicon carbide substrate and the piezoelectric layer; wherein
an acoustic velocity of a bulk wave that propagates through the low-acoustic-velocity film is less than an acoustic velocity of a bulk wave that propagates through the piezoelectric layer.

9. An acoustic wave device comprising:
a supporting substrate;
a piezoelectric layer on the supporting substrate; and
an IDT electrode on the piezoelectric layer; wherein the supporting substrate is a silicon carbide substrate with a hexagonal crystal structure;
a major surface of the silicon carbide substrate is one of an a-plane and an m-plane;
a propagation angle $\psi_{SiC}$ in the silicon carbide substrate is within a range of about 0° or greater and about 30° or less, within a range of about 70° or greater and about 110° or less, or within a range of about 150° or greater and about 180° or less, where the propagation angle $\psi_{SiC}$ is an angle at which an acoustic wave propagates;
the piezoelectric layer includes lithium niobate; and
the acoustic wave device is configured to use an SH wave as a main mode.

10. The acoustic wave device according to claim 9, wherein the silicon carbide substrate has a 4H-SiC hexagonal crystal structure.

11. The acoustic wave device according to claim 9, wherein the silicon carbide substrate has a 6H-SiC hexagonal crystal structure.

12. The acoustic wave device according to claim 9, further comprising:

a low-acoustic-velocity film between the silicon carbide substrate and the piezoelectric layer; wherein
an acoustic velocity of a bulk wave that propagates through the low-acoustic-velocity film is less than an acoustic velocity of a bulk wave that propagates through the piezoelectric layer.

13. An acoustic wave device comprising:
a supporting substrate;
a piezoelectric layer on the supporting substrate; and
an IDT electrode on the piezoelectric layer; wherein
the supporting substrate is a silicon carbide substrate with a hexagonal crystal structure;
a major surface of the silicon carbide substrate is an r-plane;
a propagation angle $\psi_{SiC}$ in the silicon carbide substrate is within a range of about 0° or greater and about 25° or less or within a range of about 105° or greater and about 140° or less, where the propagation angle $\psi_{SiC}$ is an angle at which an acoustic wave propagates;
the piezoelectric layer includes lithium niobate; and
the acoustic wave device is configured to use an SH wave as a main mode.

14. The acoustic wave device according to claim 13, wherein the silicon carbide substrate has a 4H-SiC hexagonal crystal structure.

15. The acoustic wave device according to claim 13, wherein the silicon carbide substrate has a 6H-SiC hexagonal crystal structure.

16. The acoustic wave device according to claim 13, further comprising:
a low-acoustic-velocity film between the silicon carbide substrate and the piezoelectric layer; wherein
an acoustic velocity of a bulk wave that propagates through the low-acoustic-velocity film is less than an acoustic velocity of a bulk wave that propagates through the piezoelectric layer.

* * * * *